(12) United States Patent
Murayama et al.

(10) Patent No.: US 7,488,094 B2
(45) Date of Patent: Feb. 10, 2009

(54) SEMICONDUCTOR DEVICE AND MANUFACTURING METHOD OF SEMICONDUCTOR DEVICE

(75) Inventors: Kei Murayama, Nagano (JP); Akinori Shiraishi, Nagano (JP); Masahiro Sunohara, Nagano (JP); Naoyuki Koizumi, Nagano (JP); Hideaki Sakaguchi, Nagano (JP); Mitsutoshi Higashi, Nagano (JP); Yuichi Taguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/644,977

(22) Filed: Dec. 26, 2006

(65) Prior Publication Data

US 2007/0145404 A1 Jun. 28, 2007

(30) Foreign Application Priority Data

Dec. 27, 2005 (JP) ............................ P2005-375900

(51) Int. Cl.
*F21V 5/00* (2006.01)
(52) U.S. Cl. ......................... 362/336; 362/240; 362/522
(58) Field of Classification Search ................. 362/545, 362/27, 28, 30, 240, 241, 244, 245, 249, 362/310, 311, 326, 327, 336, 337, 540, 544, 362/546, 800; 257/98–100, 787, 788, 790; 313/498, 500, 501, 502, 512; 40/564–570
See application file for complete search history.

(56) References Cited

U.S. PATENT DOCUMENTS

| 6,531,328 | B1 * | 3/2003 | Chen ............................ 438/26 |
| 6,881,980 | B1 * | 4/2005 | Ting ............................. 257/81 |
| 6,936,852 | B2 * | 8/2005 | Furukawa et al. ............. 257/79 |
| 7,168,833 | B2 * | 1/2007 | Schottland et al. .......... 362/510 |
| 7,279,719 | B2 * | 10/2007 | Suehiro et al. ................ 257/98 |
| 2001/0000622 | A1 * | 5/2001 | Reeh et al. .................... 257/98 |
| 2003/0098460 | A1 * | 5/2003 | Yasukawa et al. ............. 257/99 |
| 2004/0208210 | A1 * | 10/2004 | Inoguchi ...................... 372/36 |
| 2006/0102917 | A1 * | 5/2006 | Oyama et al. ................. 257/99 |
| 2006/0163596 | A1 * | 7/2006 | Kim et al. ..................... 257/98 |
| 2007/0108461 | A1 * | 5/2007 | Shiraishi et al. ............... 257/98 |

FOREIGN PATENT DOCUMENTS

JP 2005-235884 9/2005

* cited by examiner

*Primary Examiner*—Hargobind S Sawhney
(74) *Attorney, Agent, or Firm*—Drinker Biddle & Reath LLP (57) ABSTRACT

A semiconductor device made by mounting a light emitting element on a substrate, where an optically-transparent cover with a flat plate shape is installed on the light emitting element and a groove part for suppressing reflection of light emission of the light emitting element is formed in the cover.

11 Claims, 8 Drawing Sheets

SEMICONDUCTOR DEVICE AND MANUFACTURING METHOD OF SEMICONDUCTOR DEVICE

TECHNICAL FIELD

The present disclosure relates to a semiconductor device made by mounting a light emitting element on a substrate, and a manufacturing method of the semiconductor device.

RELATED ART

In a semiconductor device made by mounting a light emitting element on a substrate, various structures have been proposed. For example, as one example of a semiconductor device for mounting a light emitting element, the following structure has been proposed.

Figure 1:
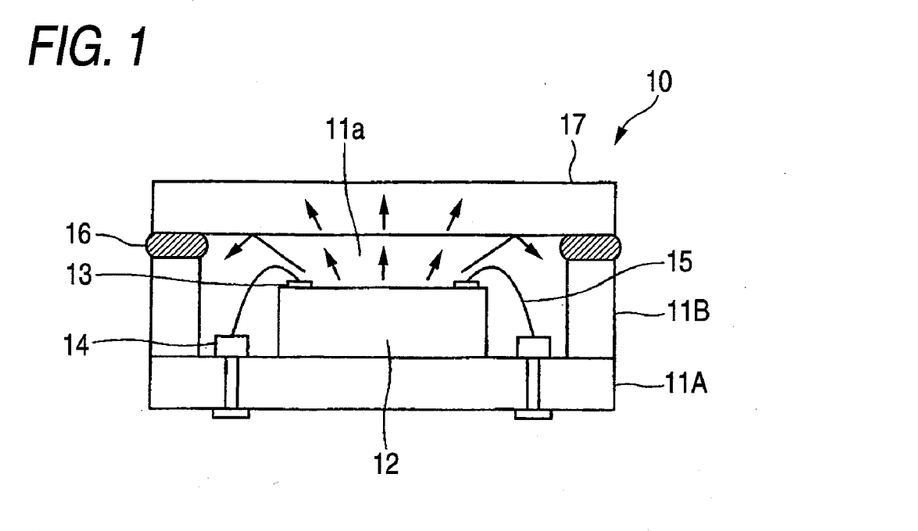
FIG. 1 is a configuration example of a related-art semiconductor device.

FIG. 1 is a sectional diagram schematically showing a semiconductor device 10 in which, for example, a light emitting element 12 is mounted. Referring to FIG. 1, the semiconductor device 10 shown in the present drawing has a structure in which the light emitting element 12 is mounted on a substrate 11A made of, for example, ceramic material.

A frame body 11B made of ceramic material is formed on the substrate 11A and further, an optically-transparent cover 17 is bonded on the frame body 11B by an adhesive 16 made of resin material. The light emitting element 12 has a structure sealed in internal space 11a defined by the substrate 11A, the frame body 11B and the cover 17.

Also, an electrode pad 13 of the light emitting element 12 is connected to an electrode pad 14 formed on the substrate 11A by a wire 15.

[Patent Reference 1] Japanese Patent Unexamined Publication No. 2005-235884

However, in the semiconductor device 10, there were cases where a problem that light emission efficiency reduces arises. For example, there were cases where light emission from the light emitting element 12 has a large percentage of being reflected by the cover 17 in the neighborhood of the peripheral edge of the cover 17 (the vicinity of a bonding part between the cover 17 and the frame body 11B). This is because an incident angle with respect to the cover 17 of light emission from the light emitting element 12 increases in the neighborhood of the peripheral edge of the cover 17.

Also, there were cases where the amount of transmission of light emission reduces by an influence of, for example, stickout of the adhesive 16 in the neighborhood of the peripheral edge of the cover 17.

SUMMARY

Embodiments of the present invention provide a semiconductor device and a manufacturing method of the semiconductor device.

More specifically, embodiments of the present invention provide a semiconductor device which is made by mounting a light emitting element and has high efficiency of light emission, and a manufacturing method for manufacturing the semiconductor device.

In the first viewpoint of one or more embodiments of the invention, a semiconductor device comprises a substrate, a light emitting element mounted on the substrate, and an optically-transparent cover with a flat plate shape which is installed above the light emitting element and has a groove part for suppressing reflection of light emission of the light emitting element formed in the side facing the light emitting element of the cover.

In the semiconductor device, reflection on a cover for covering the light emitting element is suppressed, so that light emission efficiency improves.

Also, when a fluorescent substance film is formed on the cover, uniformity of light emission in the case of obtaining a mixed color of light emission of a fluorescent substance and a light emitting element improves and this is preferable.

Also, in the case of being a structure in which the light emitting element is sealed by forming a recess part for mounting the light emitting element in the substrate and bonding the periphery of the recess part to the cover, quality of the light emitting element can be held well and this is preferable.

Also, when the groove part is formed in the vicinity of a bonding part between the substrate and the cover, an effect of suppressing reflection of light emission improves particularly and this is preferable.

Also, in the case of having through wiring which is formed so as to pass through the substrate and is electrically connected to the light emitting element, connection between the light emitting element and a connection target is facilitated.

Also, in the second viewpoint of one or more embodiments of the invention, a manufacturing method of a semiconductor device having a substrate, a light emitting element mounted on the substrate, and an optically-transparent cover, comprises amounting step of mounting the light emitting element on the substrate, a groove part formation step of forming a groove part for suppressing reflection of light emission of the light emitting element in the optically-transparent cover, and a cover installation step of installing the cover in which the groove part is formed on the substrate so that the groove part faces the light emitting element.

According to the manufacturing method of the semiconductor device, reflection on a cover for covering the light emitting element is suppressed, so that a semiconductor device in which light emission efficiency improves can be manufactured.

Also, in the case of further having a step of forming a fluorescent substance film on the cover, a semiconductor device in which flatness of the fluorescent substance improves and uniformity of light emission in the case of obtaining a mixed color of light emission of the fluorescent substance and a light emitting element improves can be manufactured.

Also, when the light emitting element is sealed by forming a recess part for mounting the light emitting element in the substrate and bonding the periphery of the recess part to the cover in the cover installation step, quality of the light emitting element can be held well.

Also, when the cover is bonded to the substrate so that the groove part is located in the vicinity of a bonding part between the substrate and the cover in the cover installation step, alignment of bonding between the cover and the substrate is facilitated and this is preferable.

Also, in the case of further having a step of forming through wiring which passes through the substrate and is electrically connected to the light emitting element, a semiconductor device in which connection between the light emitting element and a connection target is facilitated can be manufactured.

Various implementations may include one or more the following advantages. For example, a semiconductor device which is made by mounting a light emitting element and has high efficiency of light emission, and a manufacturing method for manufacturing the semiconductor device can be provided.

Other features and advantages may be apparent from the following detailed description, the accompanying drawings and the claims.

DETAILED DESCRIPTION

A semiconductor device according to the invention is a semiconductor device made by mounting a light emitting element on a substrate, and is where an optically-transparent cover with a flat plate shape is installed on the light emitting element and a groove part for suppressing reflection of light emission of the light emitting element is formed in the side facing the light emitting element of the cover.

As a result of this, when light emission from the light emitting element passes through the cover, reflection by the cover is suppressed and transmittance of the light emission improves. As a result of that, it has a feature in which light emission efficiency of the semiconductor device improves.

Next, one example of a manufacturing method and a configuration of the semiconductor device described above will be described based on the drawings.

First Embodiment

Figure 2:
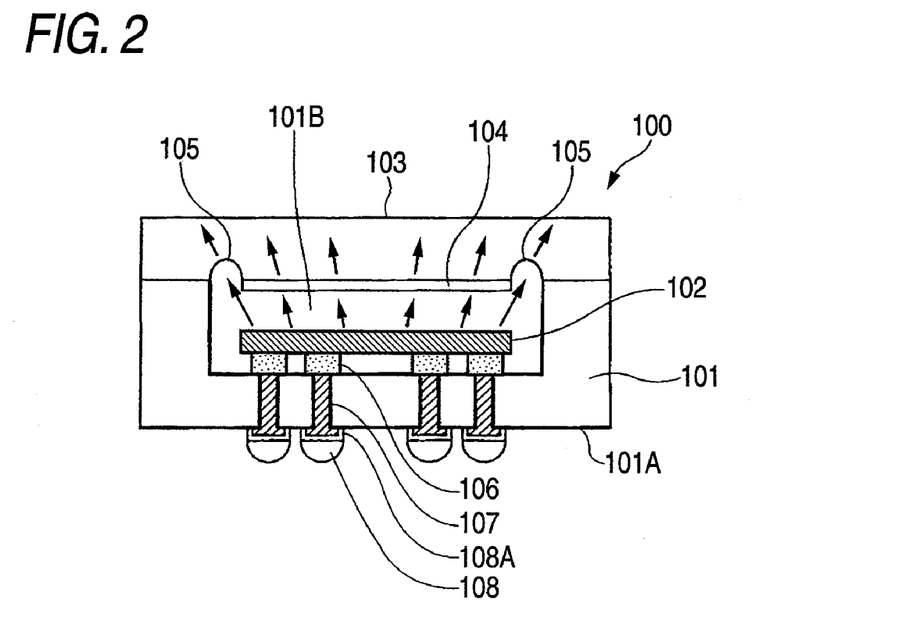
FIG. 2 is a configuration example of a semiconductor device according to a first embodiment.

FIG. 2 is a sectional diagram schematically showing a semiconductor device 100 according to a first embodiment of the invention. Referring to FIG. 2, the semiconductor device 100 is a semiconductor device made by mounting a light emitting element 102 made of, for example, an LED on a substrate 101 made of, for example, Si. Also, an optically-transparent cover 103 with a flat plate shape made of, for example, glass is installed (bonded) on the light emitting element 102.

The semiconductor device 100 according to the present embodiment has a feature in which a groove part 105 is formed in the side facing the light emitting element 102 of the cover 103. As a result of this, when light emission from the light emitting element 102 passes through the cover 103, reflection by the cover 103 is suppressed and transmittance of the light emission improves. As a result of that, it has a feature in which light emission efficiency of the semiconductor device 100 improves.

For example, when the groove part 105 is formed in the vicinity of a bonding part between the substrate 101 and the cover 103 (in the neighborhood of the peripheral edge of the cover 103), a situation in which an incident angle with respect to the cover 103 of light emission from the light emitting element 102 increases in the neighborhood of the peripheral edge of the cover 103 is suppressed. As a result of this, reflection of light emission in the neighborhood of the peripheral edge of the cover 103 can be suppressed efficiently.

In this case, when the groove part 105 has a curved surface shape in which, for example, a cross-sectional shape becomes substantially a semicircular shape, an incident angle of light emission can be decreased to effectively suppress reflection and this is preferable. Also, when the semiconductor device 100 is viewed from the plane, it is preferable to form the groove part 105 in a circular shape around the light emitting element 102 so as to surround the light emitting element 102. Also, a shape of these groove parts is one example and can be used by variously modifying and changing the shape according to specifications of the semiconductor device. For example, a cross-sectional shape of the groove part may be substantially parabolic shape.

Also, a recess part 101B for mounting the light emitting element 102 is formed in the substrate 101 and the periphery of the recess part 101B is bonded to the cover 103 and thereby the light emitting element 102 is configured to be sealed on the substrate 101. That is, space in which the light emitting element 102 is sealed is configured to be defined by the substrate 101 and the cover 103. As a result of this, the space in which the light emitting element 102 is sealed can, for example, be set in a low pressure state or be filled with inert gas and life prolongation and maintenance of quality of the light emitting element 102 can be achieved.

Also, when connection between the substrate 101 and the cover 103 is made by anodic bonding, space in which the light emitting element is sealed is held clean as compared with the case of being bonded by organic material such as resin, so that quality of the light emitting element 102 improves and this is preferable. Also, as compared with the case of being bonded by organic material such as resin, the cover 103 is held clean and particularly, stickout etc. of an adhesive do not occur in the neighborhood of the bonding part between the cover 103 and the substrate 101, so that transmittance of light emission improves and this is preferable.

Also, in the semiconductor device 100 according to the embodiment, a fluorescent substance film 104 is formed on an inner surface of the cover 103 (the side of the recess part 101B). As a result of this, in the semiconductor device 100 according to the embodiment, resin etc. including a fluorescent substance or the fluorescent substance film are not applied to the light emitting element (LED) directly, so that heat dissipation of the light emitting element 102 improves and an influence of reduction in quality by heat generation of the light emitting element is suppressed.

Also, in the semiconductor device 100 according to the embodiment, the fluorescent substance film 104 is formed on the cover 103 with the flat plate shape, so that uniformity of a film thickness of the fluorescent substance film 104 can be formed well using, for example, a printing method. Further, the semiconductor device according to the embodiment has a feature in which uniformity of a light emission color or intensity of light emission is good since it is unnecessary to form the fluorescent substance film on the side of the light emitting element 102.

Also, the light emitting element 102 is electrically connected to a via plug (through wiring) 107 formed so as to pass through the bottom of the substrate 101 through a bump (Au bump) 106 made of, for example, Au.

A connection layer 108A made of, for example, a Ni/Au plated layer is formed on the side opposite to the side on which the light emitting element 102 is connected to the via plug 107 and further a solder bump 108 is formed in the connection layer 108A. That is, by forming the via plug 107, the light emitting element 102 can easily be connected to a connection target (for example, a motherboard) of the outside of the space in which the light emitting element 102 is sealed. Also, a connection layer made of, for example, a Ni/Au plated layer may be formed between the bump 106 and the via plug 107, but illustration is omitted in the present drawing.

Also, when the substrate 101 is made of, for example, Si, it becomes easy to process the substrate 101 in a fine shape and this is preferable. For example, Si as feature in which fine processing is easier as compared with material such as ceramic. Also, when the substrate 101 is made of Si, anodic bonding can also be performed between the substrate 101 and the cover 103 made of glass (borosilicate glass).

Also, an oxide film (silicon oxide film) 101A is formed on a surface of the substrate 101 and, for example, insulation between the substrate 101 and the via plug 107 or between the substrate 101 and the bump 106 is performed.

Next, one example of a manufacturing method for manufacturing the semiconductor device 100 will be described by following a procedure based on FIGS. 3A to 3M. However, in the following drawings, the same reference numerals are assigned to the parts described above and the description may be omitted. Also, in the following embodiment, plural semiconductor device are formed using one substrate.

Figure 3A:
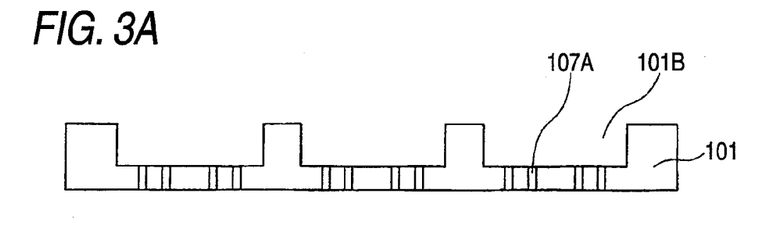
FIG. 3A is a diagram showing a method for manufacturing the semiconductor device of FIG. 2 (first).

First, in a step shown in FIG. 3A, a substrate 101 made of, for example, Si is etched and patterned, and plural recess parts 101B for installing light emitting elements and plural via holes 107A which pass through the substrate 101 and form via plugs 107 are formed.

Figure 3B:
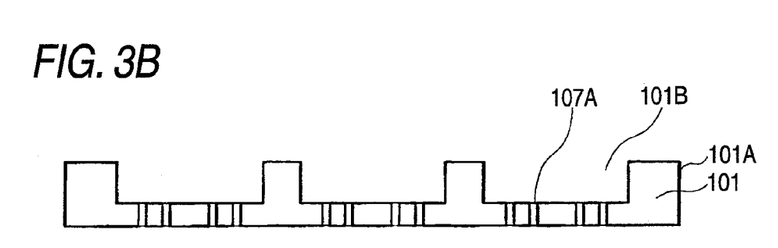
FIG. 3B is a diagram showing a method for manufacturing the semiconductor device of FIG. 2 (second).

Next, in a step shown in FIG. 3B, an oxide film (may be called a silicon oxide film or a thermal oxide film) 101A is formed on a surface of the substrate 101 including inner wall surfaces of the recess parts 101B or inner wall surfaces of the via holes 107A by, for example, a thermal CVD method.

Figure 3C:
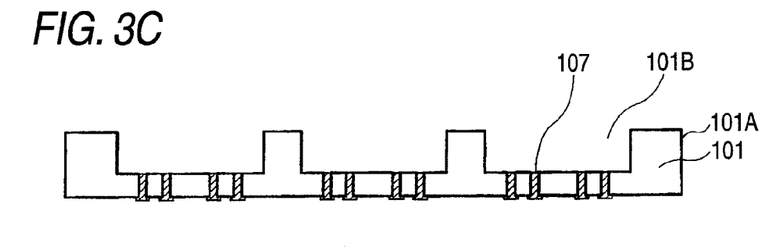
FIG. 3C is a diagram showing a method for manufacturing the semiconductor device of FIG. 2 (third).

Then, in a step shown in FIG. 3C, the via plugs 107 are formed in the via holes 107A by, for example, a plating method of Cu (for example, a via fill plating method).

Figure 3D:
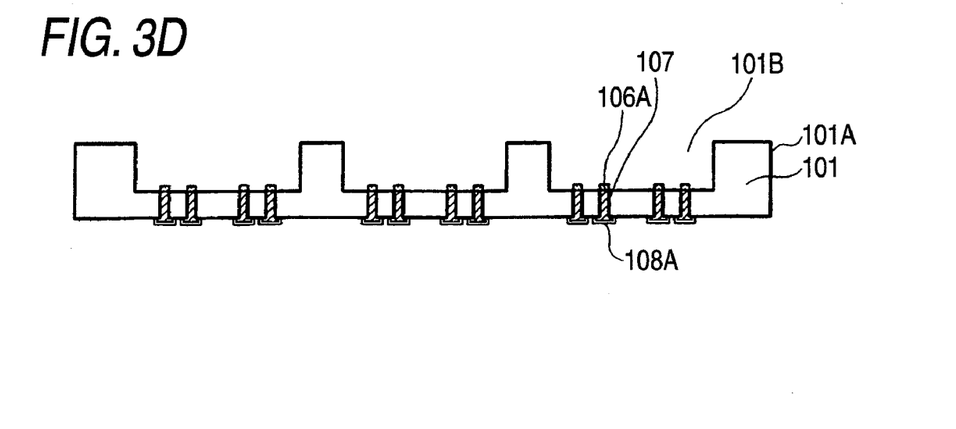
FIG. 3D is a diagram showing a method for manufacturing the semiconductor device of FIG. 2 (fourth).
Figure 3E:
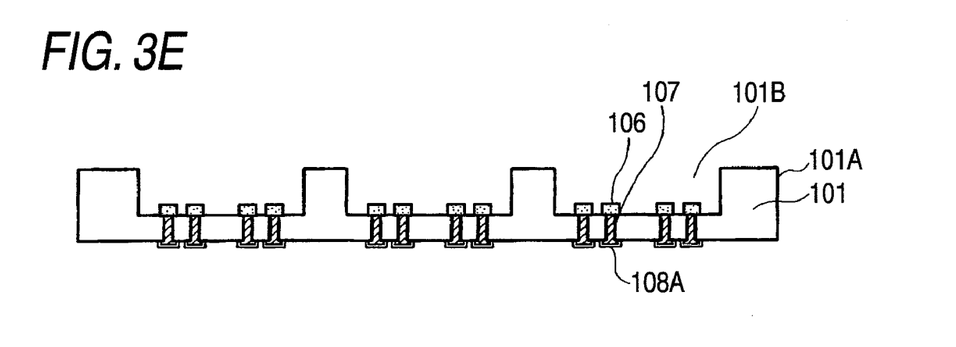
FIG. 3E is a diagram showing a method for manufacturing the semiconductor device of FIG. 2 (fifth).

Then, in a step shown in FIG. 3D, connection layers 106A, 108A made of, for example, Ni/Au are formed by, for example, a plating method. In this case, the connection layer 106A is formed on the side of the recess part 101B of the via plug 107 and the connection layer 108A is formed on the side opposite to the recess part 101B Then, in a step shown in FIG. 3E, a bump (Au bump) 106 is formed on the connection layer 106A. In addition, after the present drawing, illustration of the connection layer 106A is omitted. Also, the Au bump may be disposed in an electrode pad of the light emitting element.

Figure 3F:
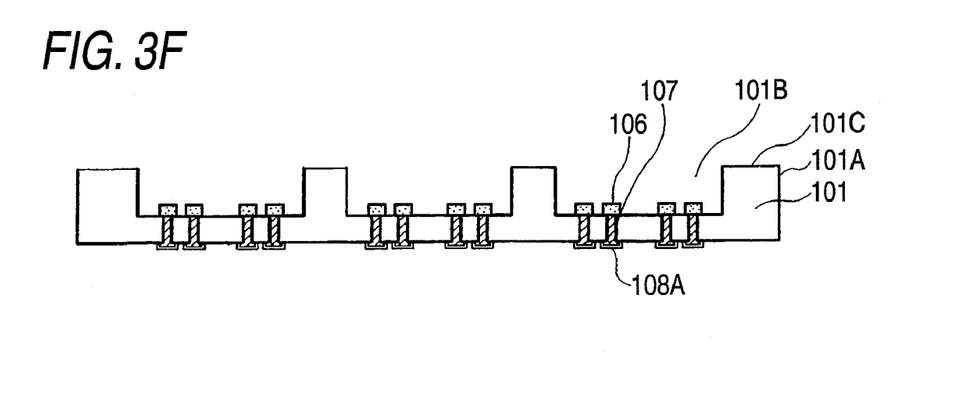
FIG. 3F is a diagram showing a method for manufacturing the semiconductor device of FIG. 2 (sixth).

Then, in a step shown in FIG. 3F, the oxide film 101A of a surface of a protrusion part 101C of the periphery of the recess part 101B is removed by, for example, mask etching. In a subsequent step, a cover made of glass is bonded to the portion in which the oxide film is removed by the present step.

Figure 3G:
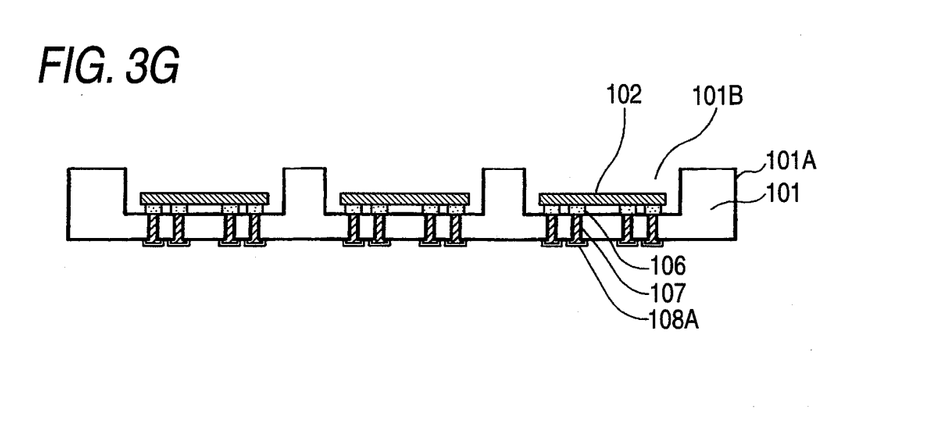
FIG. 3G is a diagram showing a method for manufacturing the semiconductor device of FIG. 2 (seventh).

Then, in a step shown in FIG. 3G, a light emitting element 102 made of, for example, an LED is installed in the recess part 101B. In this case, the light emitting element 102 is mounted so that the light emitting element 102 is electrically bonded to the bump 106 using, for example, thermal compression bonding or ultrasonic bonding and the light emitting element 102 is electrically connected to the via plug 107 through the bump 106.

Figure 3H:
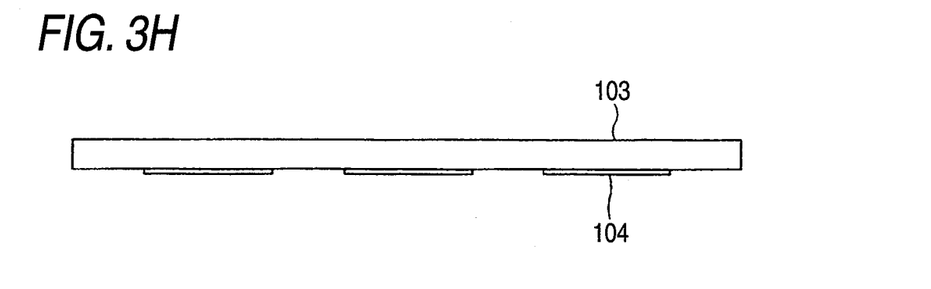
FIG. 3H is a diagram showing a method for manufacturing the semiconductor device of FIG. 2 (eighth).

Then, in a step shown in FIG. 3H, a fluorescent substance film 104 is patterned and formed on a cover 103 with a flat plate shape made of, for example, borosilicate glass by, for example, a printing method. In the manufacturing method of the semiconductor device according to the embodiment, the fluorescent substance film 104 is formed on the cover 103 with the flat plate shape as described above, so that uniformity of a film thickness of the fluorescent substance film 104 can be formed well using, for example, a printing method. As a result of that, uniformity of a light emission color or intensity of light emission of the semiconductor device can be improved.

Also in this case, it is preferable to pattern the fluorescent substance film so that the cover 103 makes direct contact with the substrate 101 without forming the fluorescent substance film 104 on the portion in which the cover 103 is bonded to the substrate 101.

Figure 3I:
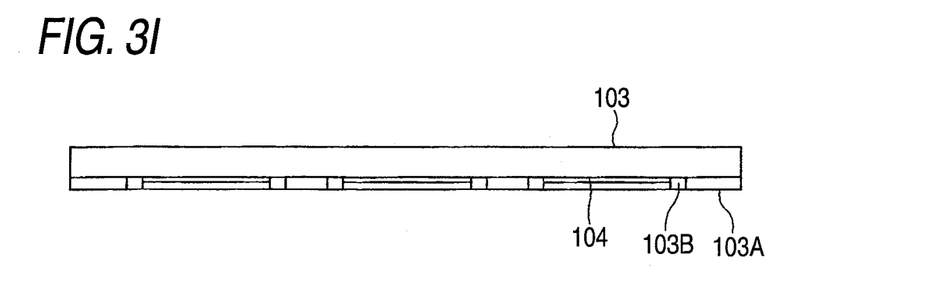
FIG. 3I is a diagram showing a method for manufacturing the semiconductor device of FIG. 2 (ninth).

Then, in a step shown in FIG. 3I, a resist layer is formed on the cover 103 so as to cover the fluorescent substance film 104 and the resist layer is patterned and thereby, a resist pattern 103A having openings 103B is formed.

Figure 3J:
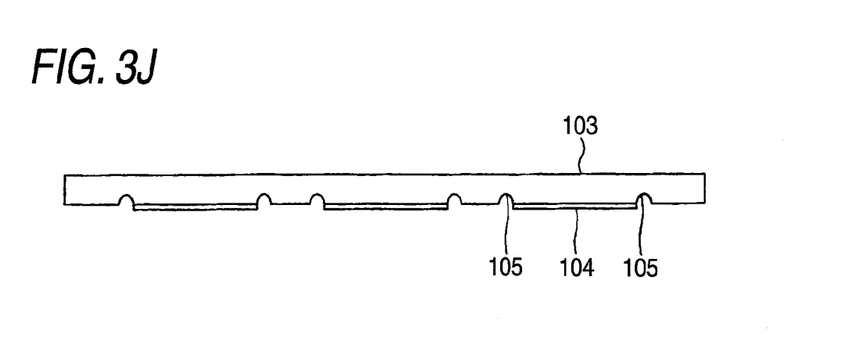
FIG. 3J is a diagram showing a method for manufacturing the semiconductor device of FIG. 2 (tenth).

Then, in a step shown in FIG. 3J, groove parts 105 are formed in the cover 103 exposed from the openings 103B by, for example, sand blast processing or plasma etching processing. In this case, a cross-sectional shape of the groove part 105 becomes substantially a semicircular shape.

Figure 3K:
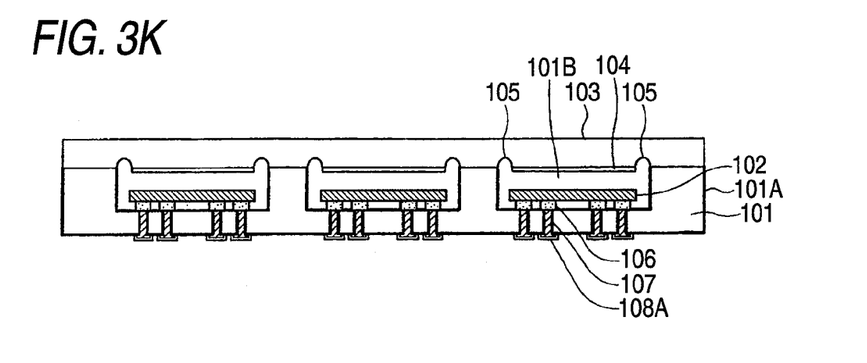
FIG. 3K is a diagram showing a method for manufacturing the semiconductor device of FIG. 2 (eleventh).

Then, in a step shown in FIG. 3K, the cover 103 in which the groove parts 105 are formed is bonded to the substrate 101 by, for example, anodic bonding so that the groove parts 105 face the light emitting element 102, and a structure in which the light emitting element 102 is sealed on the substrate 101 is formed. In this case, the anodic bonding is performed by applying a high voltage between the cover 103 and the substrate 101 and increasing temperature of the cover 103 and the substrate 101.

When the anodic bonding is performed, Si constructing the substrate is coupled to oxygen in glass constructing the cover and bonding with good and stable bonding force is performed. Also, the feature is that impurities or gas, etc. contaminating space in which the light emitting element is sealed rarely occur unlike bonding using resin material.

Figure 3L:
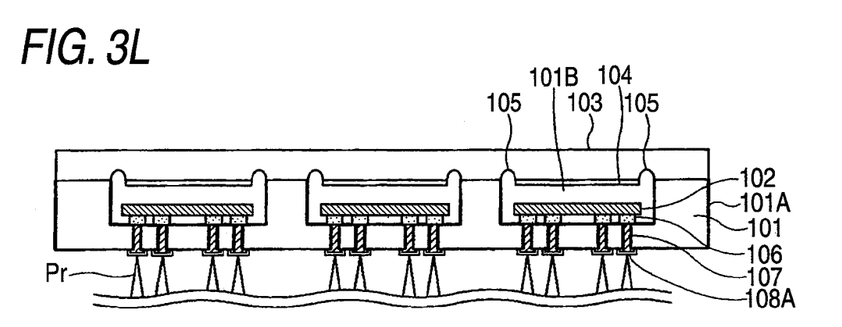
FIG. 3L is a diagram showing a method for manufacturing the semiconductor device of FIG. 2 (twelfth).

Then, in a step shown in FIG. 3L, a probe Pr is brought into contact with the connection layer 108A, and inspections of current/voltage and luminance of the semiconductor device are performed.

Figure 3M:
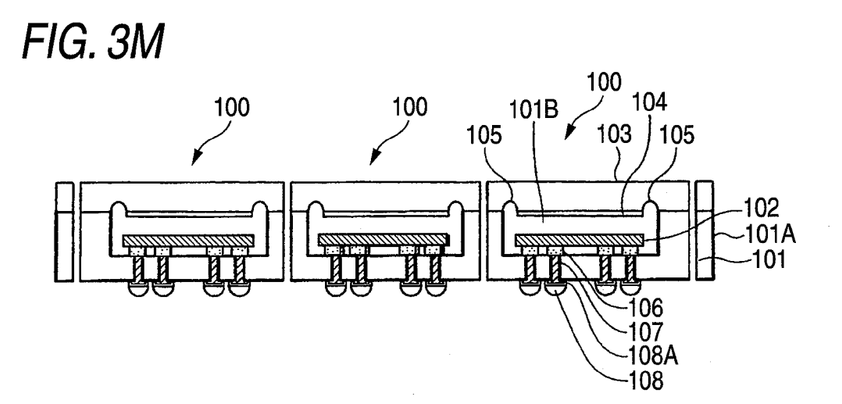
FIG. 3M is a diagram showing a method for manufacturing the semiconductor device of FIG. 2 (thirteenth).

Then, in a step shown in FIG. 3M, a solder bump 108 is formed in the connection layers 108A and further the substrate 101 and the cover 103 are cut by dicing and are divided into individual pieces and thereby a plurality of the semiconductor device 100 described previously can be formed.

In the manufacturing method of the semiconductor device described above, the groove parts 105 are formed in the cover 103 for covering the light emitting element 102, so that the semiconductor device in which reflection of light emission in the cover 103 is suppressed and light emission efficiency improves can be manufactured.

Also, the cover 103 is bonded to the substrate 101 with the groove parts 105 formed, so that an effect of facilitating relative alignment between the cover 103 and the substrate 101 is obtained. For example, glass preferably makes contact with Si in a bonding surface of the cover 103 and the substrate 101, so that, for example, the fluorescent substance film 104 is preferably removed. In the manufacturing method described above, the groove parts 105 are formed in the vicinity of the bonding surface and a possibility that, for example, the fluorescent substance film is bonded so as to be in a position corresponding to the bonding surface is decreased, and alignment between the cover and the substrate is facilitated.

Also, since connection between the cover 103 and the substrate 101 is made by anodic bonding, as compared with the case of being bonded by organic material such as resin, the cover 103 is held clean and particularly, stickout etc. of an adhesive do not occur in the neighborhood of a bonding part between the cover 103 and the substrate 101, so that transmittance of light emission improves and this is preferable.

Second Embodiment

Also, the manufacturing method of the semiconductor device described above can be modified and changed, for example, variously as shown below.

Figure 4A:
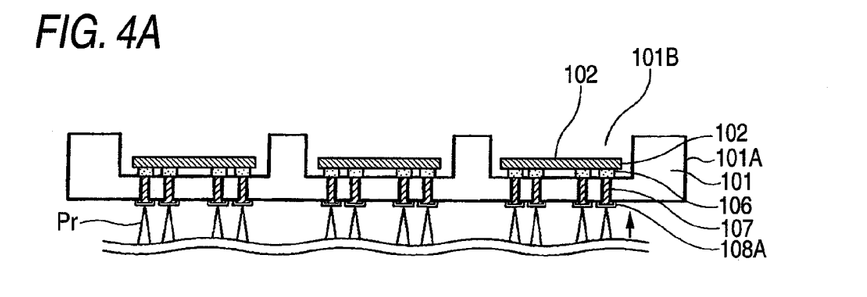
FIG. 4A is a diagram showing a manufacturing method of a semiconductor device according to a second embodiment (first).
Figure 4B:
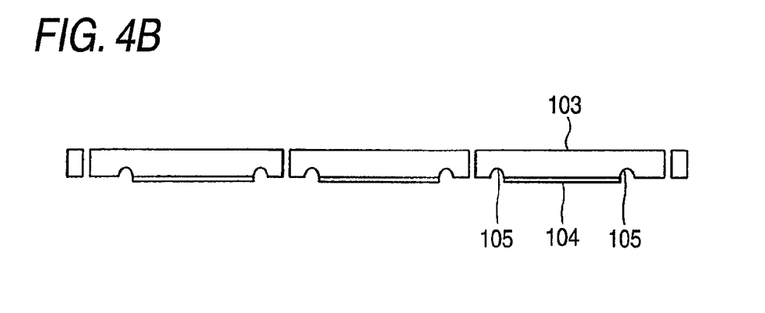
FIG. 4B is a diagram showing a manufacturing method of the semiconductor device according to the second embodiment (second).
Figure 4C:
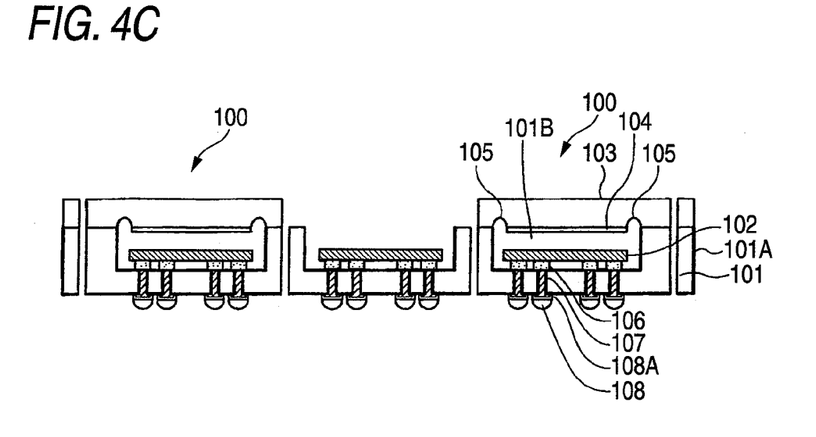
FIG. 4C is a diagram showing a manufacturing method of the semiconductor device according to the second embodiment (third).

FIGS. 4A to 4C are diagrams showing a manufacturing method of a semiconductor device according to a second embodiment by following a procedure. However, in the diagrams, the same reference numerals are assigned to the parts described above and the description is omitted.

First, in steps ranging to a step shown in FIG. 4A, the steps of FIGS. 3A to 3G described in the first embodiment are performed. Next, in the step shown in FIG. 4A, a probe Pr is brought into contact with a connection layer 108A and inspections of current/voltage and luminance of a light emitting element 102 (semiconductor device) are performed in a manner similar to the step shown in FIG. 3L described above. That is, the inspections of current/voltage and luminance of the light emitting element are performed at a stage of mounting the light emitting element on a substrate before a cover is bonded.

Then, the steps of FIGS. 3H to 3J described in the first embodiment are performed. Then, in a step shown in FIG. 4B, the cover 103 formed in the step shown in FIG. 3J is cut by dicing and is divided into individual pieces.

Then, in a step shown in FIG. 4C, the covers 103 divided into individual pieces are bonded to a substrate 101 in which the inspections are completed in the step shown in FIG. 4A by anodic bonding in a manner similar to the case shown in FIG. 3K. In this case, the covers 103 are bonded to only the substrate of the parts in which the light emitting elements resulting in non-defective products in the inspections shown in FIG. 4A are mounted. For example, the cover is constructed so as not to be bonded to the part (the center in the diagram) in which the light emitting element in which defects of luminance, current/voltage, etc. are checked in the inspections of the step shown in FIG. 4A is mounted.

Thereafter, a solder bump 108 is formed on the connection layer 108A and further the substrate 101 is cut by dicing and is divided into individual pieces and thereby the semiconductor device 100 described previously can be formed.

In the manufacturing method according to the present embodiment, the inspections are performed before the cover is bonded in the step shown in FIG. 4A, so that the covers can be bonded to only the parts of the non-defective products in the step shown in FIG. 4C.

That is, by changing the steps of bonding of the cover and the inspections, the number of useless components is reduced and the semiconductor device can be produced efficiently.

Also, the manufacturing method of the semiconductor device is not limited to the cases described above and can be formed using various materials and methods.

As described above, the invention has been described based on the preferred embodiments, but the invention is not limited to the specific embodiments, and various modifications and changes can be made within the gist described in the claims.

According to the invention, a semiconductor device which is made by mounting a light emitting element and has high efficiency of light emission, and a manufacturing method for manufacturing the semiconductor device can be provided.

What is claimed is:

1. A semiconductor device comprising:
   a substrate;
   a light emitting element mounted on the substrate; and
   an optically-transparent cover installed above the light emitting element, the cover having a groove part for suppressing reflection of light emission of the light emitting element which is formed in the side facing the light emitting element of the cover, wherein the groove part is structurally configured so as to surround the light emitting element,
   wherein the cover has a flat plate shape and a fluorescent substance film is formed on the cover, the fluorescent substance film is provided within an area surrounded by the groove part in a state that it covers the area.

2. A semiconductor device as claimed in claim 1, wherein the substrate has a recess part for mounting the light emitting element, and the periphery of the recess part of the substrate is bonded to the cover so that the light emitting element is sealed.

3. A semiconductor device as claimed in claim 2, where the groove part is formed in the vicinity of a bonding part between the substrate and the cover.

4. A semiconductor device as claimed in claim 1, further comprising:
   a through wiring which is formed so as to pass through the substrate and is electrically connected to the light emitting element.

5. A semiconductor device as claimed in claim 1, wherein the groove part is structurally configured in a circular shape so as to surround the light emitting element.

6. A manufacturing method of a semiconductor device having a substrate, a light emitting element mounted on the substrate and an optically-transparent cover, the method comprising:
   a mounting step of mounting the light emitting element on the substrate;
   an inspection step of performing an inspection of the light emitting element mounted on the substrate so as to determine whether or not the light emitting element is defective;
   a groove part formation step of forming a groove part for suppressing reflection of light emission of the light emitting element in the optically-transparent cover;

a cover installation step of installing the cover in which the groove part is formed on the substrate so that the groove part faces the light emitting element, the cover installation step only being performed if the inspection step has determined that the light emitting element is not defective;

a substrate dividing step of dividing the substrate into individual pieces so as to result in individual semiconductor devices; and a step of forming a fluorescent substance film on the cover, wherein the cover has a flat plate shape and the fluorescent substance film is formed on the cover, wherein the fluorescent substance film is provided within an area surrounded by the groove part in a state that it covers the area.

7. A manufacturing method of a semiconductor device as claimed in claim 6, further comprising:

a step of forming a recess part for mounting the light emitting element in the substrate, wherein in the cover installation step, the periphery of the recess part of the substrate is bonded to the cover so that the light emitting element is sealed.

8. A manufacturing method of a semiconductor device as claimed in claim 7, where said cover is bonded to said substrate so that the groove part is located in the vicinity of a bonding part between the substrate and the cover in the cover installation step.

9. A manufacturing method of a semiconductor device as claimed in claim 6, further comprising:

a step of forming through wiring which passes through the substrate and is electrically connected to the light emitting element.

10. A manufacturing method of a semiconductor device as in claim 9, wherein the inspection step inspects the light emitting element mounted on the substrate via the through wiring.

11. A manufacturing method of a semiconductor device as in claim 6, when in the cover installation step the substrate and the cover is bonded by anodic bonding.

* * * * *